(12) United States Patent (10) Patent No.: US 12,696,722 B2
Seo (45) Date of Patent: Jul. 28, 2026

(54) WAFER CONTAINER

(71) Applicant: Samsung Electronics Co., Ltd.,
Suwon-si (KR)

(72) Inventor: Wonguk Seo, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 26 days.

(21) Appl. No.: 18/648,652

(22) Filed: Apr. 29, 2024

(65) Prior Publication Data

US 2025/0174479 A1 May 29, 2025

(30) Foreign Application Priority Data

Nov. 27, 2023 (KR) ........................ 10-2023-0166414

(51) Int. Cl.
*H10P 72/30* (2026.01)
(52) U.S. Cl.
CPC ................................ *H10P 72/3404* (2026.01)
(58) Field of Classification Search
CPC ........ H01L 21/67769; E06B 9/17; E06B 9/11;
E06B 9/02
USPC ........................................... 206/711; 160/98
See application file for complete search history.

(56) References Cited

U.S. PATENT DOCUMENTS

| | | | | |
|---|---|---|---|---|
| 1,413,895 A | * | 4/1922 | Bretos | E06B 9/17 |
| | | | | 160/195 |
| 1,549,714 A | * | 8/1925 | Bretos | E06B 9/17 |
| | | | | 16/DIG. 31 |
| 2,592,888 A | * | 4/1952 | Greegor | E06B 9/17 |
| | | | | 160/133 |
| 2,621,726 A | * | 12/1952 | Greegor | E06B 9/17 |
| | | | | 160/180 |
| 2,775,928 A | * | 1/1957 | Morrison | F24F 13/15 |
| | | | | 454/227 |
| 2,954,081 A | * | 9/1960 | Recchione | E06B 9/17 |
| | | | | 160/219 |
| 4,368,771 A | * | 1/1983 | Hopper | E06B 9/78 |
| | | | | 160/121.1 |
| 4,766,941 A | * | 8/1988 | Sloop | E06B 9/40 |
| | | | | 160/310 |
| 5,460,216 A | * | 10/1995 | Hirao | E06B 9/17 |
| | | | | 160/133 |
| 5,976,009 A | * | 11/1999 | Achen | E06B 7/082 |
| | | | | 52/198 |
| 6,899,145 B2 | | 5/2005 | Aggarwal | |

(Continued)

FOREIGN PATENT DOCUMENTS

| | | |
|---|---|---|
| JP | 2002-093880 A | 3/2002 |
| KR | 10-2001-0113497 A | 12/2001 |

(Continued)

*Primary Examiner* — Ernesto A Grano
*Assistant Examiner* — Symren K Sanghera
(74) *Attorney, Agent, or Firm* — Harness, Dickey &
Pierce, P.L.C.

(57) ABSTRACT

According to various example embodiments, there may be
provided a wafer container comprising a housing configured
to receive a plurality of wafers, the housing including an
open front surface, a shutter configured to shut the open
front surface of the housing, the shutter including an opening
through which the wafers enter one by one, and a lifter
configured to lift the shutter to position the opening at a
desired height.

19 Claims, 3 Drawing Sheets

(56) References Cited

U.S. PATENT DOCUMENTS

| 7,151,450 B2 * | 12/2006 | Beggs ..................... E06B 9/88 |
| | | 340/545.7 |
| 7,523,769 B2 | 4/2009 | Miyajima et al. |
| 7,690,414 B2 * | 4/2010 | Knowles ............... B60J 1/2025 |
| | | 160/90 |
| 8,220,521 B2 * | 7/2012 | Tischer ................. B64C 1/1484 |
| | | 160/90 |
| 9,437,466 B2 | 9/2016 | Sakiya et al. |
| 9,881,826 B2 | 1/2018 | Maraschin et al. |
| 10,297,480 B2 | 5/2019 | Maraschin et al. |
| 2001/0055522 A1 | 12/2001 | Kaneda et al. |
| 2006/0037718 A1 * | 2/2006 | Coenraets ................. E06B 9/56 |
| | | 160/133 |
| 2007/0068635 A1 * | 3/2007 | Nicolosi ................. E06B 9/264 |
| | | 160/98 |
| 2007/0272367 A1 * | 11/2007 | Gomaa .............. E06B 9/17046 |
| | | 160/116 |
| 2007/0277942 A1 * | 12/2007 | Dondlinger ............... E06B 9/17 |
| | | 160/271 |
| 2008/0210388 A1 * | 9/2008 | Padan ..................... E06B 9/302 |
| | | 160/201 |
| 2009/0236051 A1 * | 9/2009 | Beggs ................ E06B 9/17076 |
| | | 160/262 |
| 2009/0236052 A1 * | 9/2009 | Beggs ....................... E06B 9/13 |
| | | 160/265 |
| 2010/0218431 A1 * | 9/2010 | Hardison, III .......... E06B 9/582 |
| | | 49/475.1 |
| 2011/0139675 A1 * | 6/2011 | Ku ...................... H10P 72/1912 |
| | | 206/711 |
| 2012/0118514 A1 * | 5/2012 | Hughes .................... E06B 9/08 |
| | | 160/133 |
| 2015/0030416 A1 * | 1/2015 | Sakiya ............... H10P 72/0608 |
| | | 206/711 |
| 2016/0118282 A1 * | 4/2016 | Maraschin .......... H10P 72/3404 |
| | | 206/711 |
| 2018/0305977 A1 * | 10/2018 | Balay ....................... E06B 9/11 |
| 2019/0071923 A1 * | 3/2019 | Ouyang ............. E06B 9/17007 |
| 2020/0003004 A1 * | 1/2020 | Brunton ................. E06B 9/582 |
| 2022/0235604 A1 * | 7/2022 | Owen ...................... E06B 9/17 |
| 2025/0174479 A1 * | 5/2025 | Seo .................... H10P 72/3404 |

FOREIGN PATENT DOCUMENTS

| KR | 10-2005-0101724 A | 10/2005 |
| KR | 100744349 B1 | 7/2007 |
| KR | 10-2010-0078029 A | 7/2010 |
| KR | 10-2016-0048655 A | 5/2016 |
| KR | 10-2023-0065764 A | 5/2023 |

* cited by examiner

WAFER CONTAINER

CROSS-RELATED APPLICATION

This application claims priority under 35 USC § 119 to Korean Patent Application No. 10-2023-0166414, filed on Nov. 27, 2023 in the Korean Intellectual Property Office (KIPO), the contents of which are herein incorporated by reference in their entirety.

BACKGROUND

Various example embodiments relate to a wafer container. More particularly, various example embodiments relate to a wafer container configured to receive a wafer before and after a semiconductor fabrication process.

Generally, a plurality of wafers may be received in a container. The container may be transferred between semiconductor fabrication processes. For example, the container may be transferred between a process for coating a photoresist film on the wafer and a process for exposing the photoresist film.

According to various example embodiments, when the container is opened, humidity in the container may be rapidly changed. This rapid change of humidity may have bad influence on reliability of the wafers. In order to reduce the change in humidity, a large amount of a nitrogen gas may be supplied to the container.

SUMMARY

Various example embodiments provide a wafer container that may be capable of preventing a rapid change of a humidity in the wafer container.

According to various example embodiments, there may be provided a wafer container comprising a housing configured to receive a plurality of wafers, the housing including an open front surface, a shutter configured to shut the open front surface of the housing, the shutter including an opening through which the wafers enter one by one, and a lifter configured to lift the shutter to position the opening at a desired height.

According to various example embodiments, there may be provided a wafer container comprising a housing configured to receive a plurality of wafers in a horizontal direction, the housing including an open front surface, a shutter configured to shut the open front surface of the housing, the shutter including an opening through which the wafers enter one by one, an upper roller configured to rotate with respect to the horizontal direction, and arranged at the open front surface of the housing, the upper roller configured to wind an upper end of the shutter thereon, a lower roller configured to rotate with respect to the horizontal direction, and arranged at the open front surface of the housing, the lower roller configured to wind a lower end of the shutter thereon, a pair of upper lifting members connected to both ends of the upper roller, wherein an upper portion of the shutter above the opening is connected to the pair of upper lifting members, a pair of lower lifting members connected to both ends of the lower roller, wherein a lower portion of the shutter under the opening is connected to the pair of lower lifting members, a pair of side beams connected between each of the upper lifting members and each of the lower lifting members to define both side surfaces of the opening, and an actuator configured to rotate the lower roller.

BRIEF DESCRIPTION OF THE DRAWINGS

Various example embodiments will be more clearly understood from the following detailed description taken in conjunction with the accompanying drawings.

FIG. 1 is a perspective view illustrating a wafer container in accordance with various example embodiments;

FIG. 2 is a front view illustrating the wafer container in FIG. 1;

FIG. 3 is a cross-sectional view taken along a line A-A' in FIG. 1; and

FIGS. 4 and 5 are a front view and a cross-sectional view illustrating an operation of the wafer container in accordance with various example embodiments.

DETAILED DESCRIPTION

Hereinafter, various example embodiments will be explained in detail with reference to the accompanying drawings.

Figure 1:
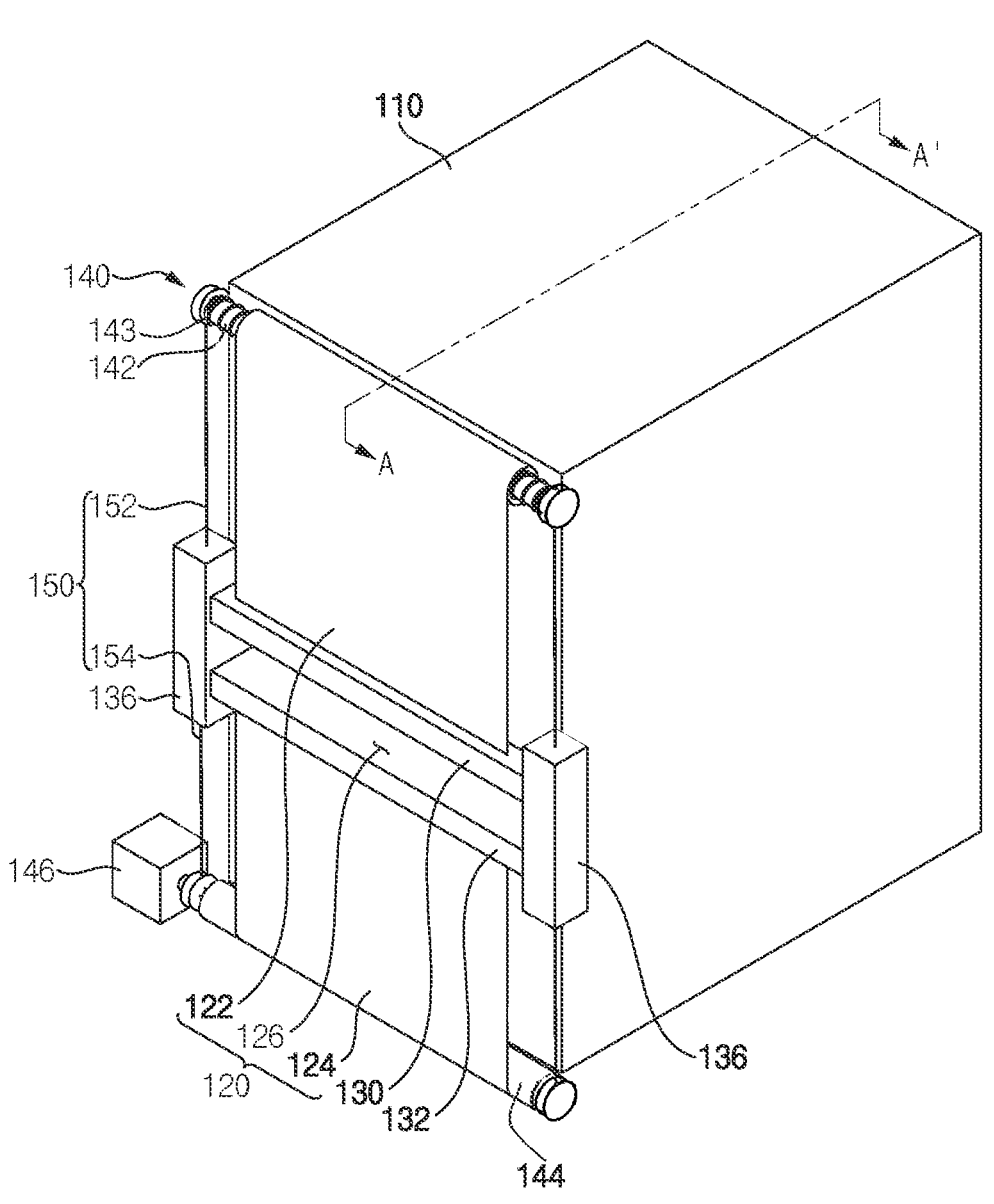
FIGS. 1 to 5 represent non-limiting, various example embodiments as described herein.
Figure 2:
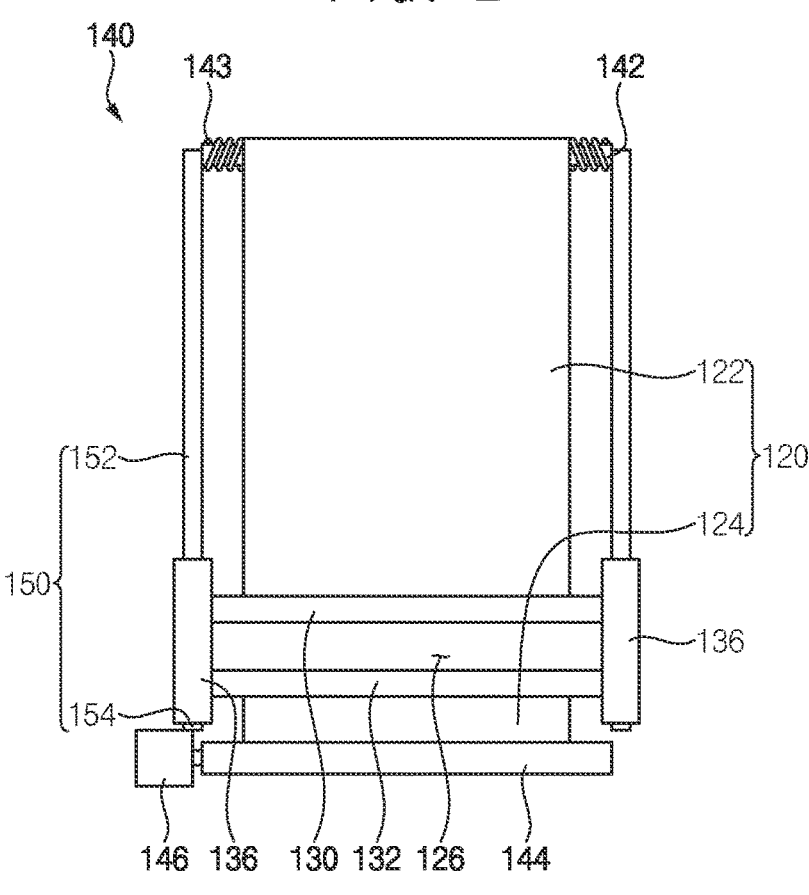
Figure 3:
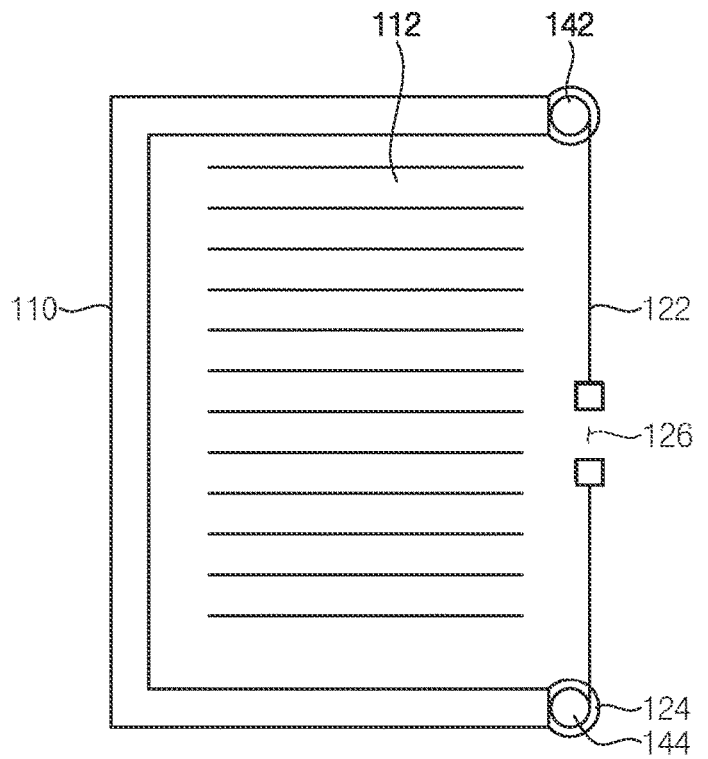

FIG. 1 is a perspective view illustrating a wafer container in accordance with various example embodiments, FIG. 2 is a front view illustrating the wafer container in FIG. 1 and FIG. 3 is a cross-sectional view taken along a line A-A' in FIG. 1.

A wafer container of various example embodiments may be configured to receive a plurality of wafers W. The wafer container may transfer the wafers between semiconductor fabrication processing equipment. For example, the wafer container may transfer the wafers W between different equipment used in the photolithography processes, e.g., the wafer container may be transferred between a processing equipment for coating a photoresist film on the wafer W and a processing equipment for exposing the photoresist film. Furthermore, in order to more uniformly maintain humidity in the wafer container between the processes, a humidity control unit may supply nitrogen gas into the wafer container.

Referring to FIGS. 1 to 3, the wafer container may include a housing 110, a shutter 120, an upper beam 130, a lower beam 132, a pair of side beams 136 and a lifter 140.

The housing 110 may be configured to support the wafers W. The housing 110 may have a rectangular parallelepiped shape, but not limited thereto. The housing 110 may have an open front surface. A plurality of slots 112 may be formed on both side inner walls of the housing 110 along a horizontal direction. The wafers W may be inserted into the slots 112. Thus, the wafers W may be received in the housing 110 along the horizontal direction.

The shutter 120 may be arranged at the open front surface of the housing 110. The shutter 120 may shut the open front surface of the housing 110. Thus, the shutter 120 may have a size configured to shut the open front surface of the housing 110. Further, the shutter 120 may include a flexible soft sheet, but example embodiments are not limited thereto.

The shutter 120 may include an opening 126. One wafer W and a robot R may enter through the opening 126. In various example embodiments, the opening 126 may have a rectangular shape extended in the horizontal direction, but example embodiments are not limited thereto. Furthermore, the opening 126 may be extended to both side surfaces of the shutter 120 along the horizontal direction, but example embodiments are not limited thereto. In this case, the opening 126 may have a width substantially the same as a width of the shutter 120. Alternatively, the opening 126 may have a width narrower than the width of the shutter 120.

Because one wafer W and the robot R may enter through the opening 126 without interference between the shutter 120, one wafer W, and the robot R, the opening 126 may have a height slightly greater than a sum of a thickness of the wafer W and a thickness of the robot R. For example, when the opening 126 has a large size, an amount of the nitrogen gas discharged from the housing 110 through the opening may be increased. In various example embodiments, in order to minimize the amount of discharged nitrogen gas without interfering between the shutter 120, one wafer W, and the robot R, the opening 126 may have an area of no more than about 5% of an area of the open front surface of the housing 110, but example embodiments are not limited thereto. For example, the area of the opening 126 may be no more than about 5% of an area of the shutter 120.

In various example embodiments, the shutter 120 may include an upper shutter 122 and a lower shutter 124. The opening 126 may be positioned between the upper shutter 122 and the lower shutter 124. That is, the opening 126 may divide the shutter 120 into the upper shutter 122 and the lower shutter 124. The upper shutter 122 and the lower shutter 124 may have substantially the same width.

The upper beam 130 may be arranged at a lower end of the upper shutter 122. The upper beam 130 may be configured to define an upper surface of the opening 126. That is, the upper surface of the opening 126 may correspond to the upper beam 130. Furthermore, the upper beam 130 may have a width slightly wider than the width of the upper shutter 122. Thus, both ends of the upper beam 130 may protrude from both side surfaces of the upper shutter 122 in the horizontal direction.

The lower beam 132 may be arranged at an upper end of the lower shutter 124. The lower beam 132 may be configured to define a lower surface of the opening 126. That is, the lower surface of the opening 126 may correspond to the lower beam 132. Furthermore, the lower beam 132 may have a width slightly wider than the width of the lower shutter 124. Thus, both ends of the lower beam 132 may be protruded from both side surfaces of the lower shutter 124.

The pair of the side beams 136 may be connected between the both ends of the upper beam 130 and the both ends of the lower beam 132. The side beams 136 may be configured to define both side surfaces of the opening 126. That is, the both side surfaces of the opening 126 may correspond to the side beams 136. Each of the side beams 136 may have a length longer than a distance between the upper beam 130 and the lower beam 132, i.e., the height of the opening 126. Thus, an upper end of each of the side beams 136 may be positioned over the upper beam 130. A lower end of each of the side beams 136 may be positioned under the lower beam 132.

The lifter 140 may lift the shutter 120 to position the opening 126 at a desired height. For example, the lifter 140 may lift the side beams 136. Because the upper shutter 122 and the lower shutter 124 may be connected with the side beams 136 through the upper beam 130 and the lower beam 132, the shutter 120 may also be lifted by lifting the side beams 136 by the lifter 140.

In various example embodiments, the lifter 140 may include an upper roller 142, a lower roller 144, a pair of lifting members 150 and an actuator 146.

The upper roller 142 may be arranged at the upper end of the open front surface of the housing 110. For example, the upper roller 142 may be configured to rotate, with respect to the horizontal direction. The upper end of the upper shutter 122 may be wound on the upper roller 142. A spring 143 may resiliently support the upper roller 142 toward a winding direction of the upper shutter 122.

The lower roller 144 may be arranged at the lower end of the open front surface of the housing 110. Particularly, the lower roller 144 may be configured to rotate with respect to the horizontal direction. The lower end of the lower shutter 124 may be wound on the lower roller 144.

Each of the lifting members 150 may be connected between the upper roller 142 and the lower roller 144. The lifting members 150 may be lifted by the rotations of the upper roller 142 and the lower roller 144.

In various example embodiments, each of the lifting members 150 may include an upper lifting member 152 and a lower lifting member 154. An upper end of the upper lifting member 152 may be connected to the upper roller 142. Because the upper roller 142 may be resiliently supported by the spring 143, a resilient force of the spring 143 may be applied to the upper lifting member 152. Thus, a constant tension may be continuously applied to the upper lifting member 1522. A lower end of the upper lifting member 152 may be fixed to the upper end of the side beam 136. A lower end of the lower lifting member 154 may be connected to the lower roller 144. An upper end of the lower lifting member 154 may be fixed to the lower end of the side beam 136. That is, the upper lifting member 152 and the lower lifting member 154 may be connected with each other via the side beam 136.

In various example embodiments, the lifting member 150 may include a belt, a wire, etc., but example embodiments are not limited thereto. For example, the lifting member 150 may include various members lifted between the upper roller 142 and the lower roller 144.

The actuator 146 may rotate at least one of the upper roller 142 and the lower roller 144. In various example embodiments, the actuator 146 may rotate the lower roller 144. That is, the actuator 146 may be connected to the lower roller 144 to transfer a rotary force to the lower roller 144. The actuator 146 may include a motor, but example embodiments are not limited thereto. For example, the shutter 120 may be upwardly moved by a forward rotation of the motor. In contrast, the shutter 120 may be downwardly moved by a reverse rotation of the motor.

Figure 4:
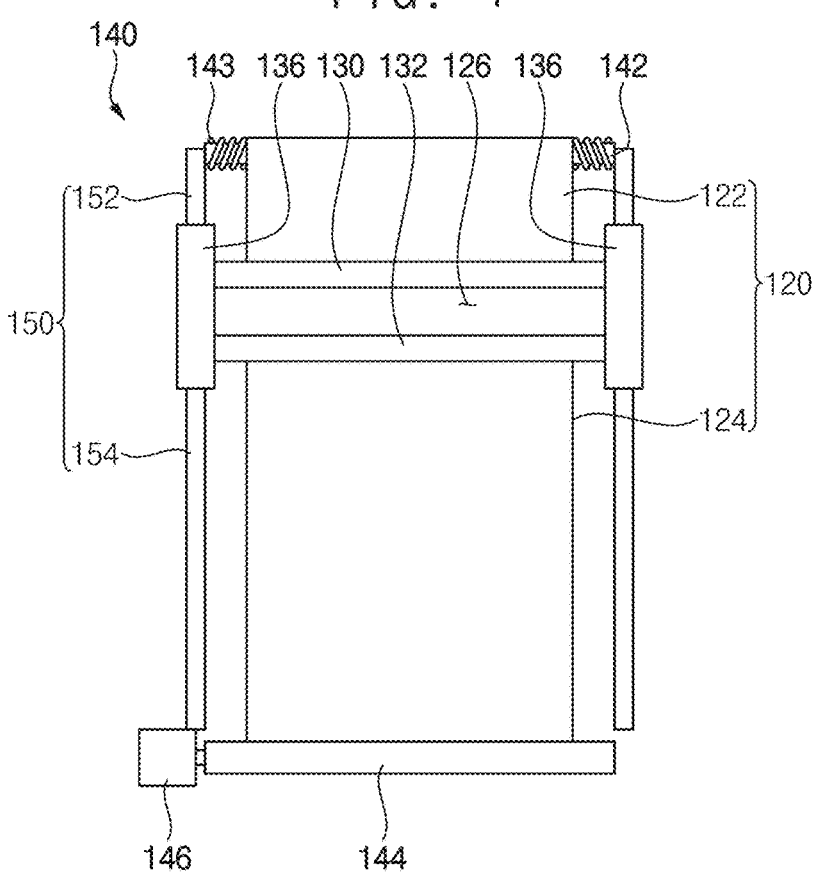
Figure 5:
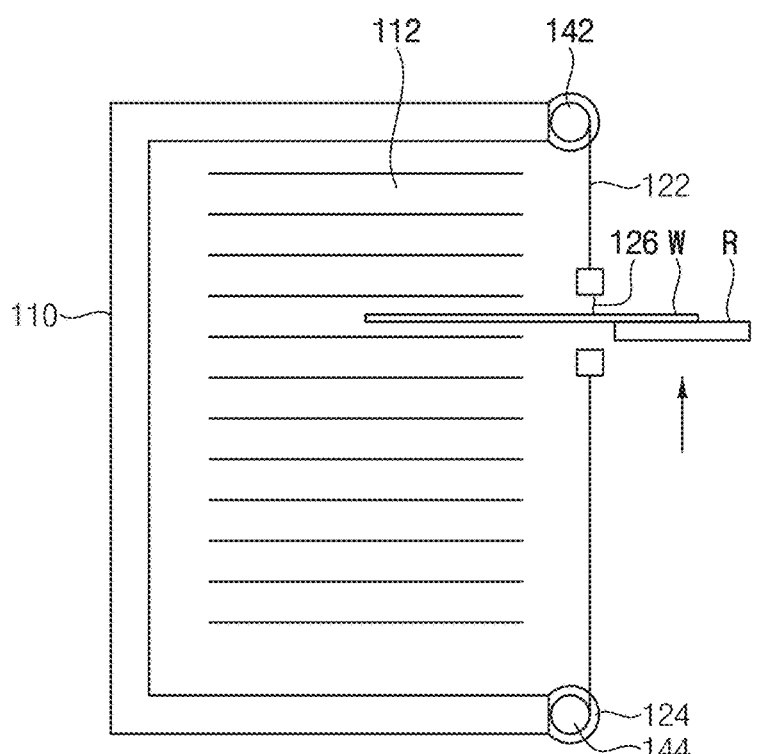

FIGS. 4 and 5 are a front view and a cross-sectional view illustrating an operation of the wafer container in accordance with various example embodiments.

Referring to FIGS. 3 and 4, when the wafer container is in a standby mode, the opening 126 may be positioned at a lowermost portion of the front surface of the housing 110. That is, the opening 126 may not be positioned between the slots 112. Thus, the wafers W received between the slots 112 may not be directly exposed through the opening 126. Therefore, the nitrogen gas flowing across the wafers W may not be directly discharged from the housing 110 through the opening 126.

Referring to FIGS. 4 and 5, in order to unload any one of the wafers W from the wafer container, the actuator 146 may rotate the lower roller 144.

The lower lifting member 154 may be upwardly moved by the rotation of the lower roller 144. Furthermore, the lower shutter 124 wound on the lower roller 144 may also be upwardly expanded.

The upward movement of the lower lifting member 154 may be transferred to the upper lifting member 152 through the side beam 136. The upward movement of the upper lifting member 152 may rotate the upper roller 142. Thus, the upper shutter 122 may be wound on the rotating upper roller 142. As a result, the opening 126 may also be upwardly moved by the upward movements of the upper shutter 122 and the lower shutter 124 so that the opening 126 may be positioned at the desired height.

The robot R may enter into the slots 112 through the opening 126 to unload the wafer W from the wafer container.

According to various example embodiments, the shutter may include the opening having the height through which one wafer may enter. The lifter may lift the shutter to position the opening at the desired height. Thus, when the wafer enters through the opening, the opening of the container may be minimally suppressed to reduce or prevent humidity in the wafer container from being rapidly changed. As a result, a consumed quantity of a nitrogen gas for maintaining humidity in the wafer container may be greatly decreased.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

The foregoing is illustrative of various example embodiments and is not to be construed as limiting thereof. Although a few example embodiments have been described, those skilled in the art will readily appreciate that many modifications are possible in the various example embodiments without droplet departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A wafer container comprising:
a housing configured to receive a plurality of wafers, the housing including an open surface;
a shutter proximate to the open surface and configured to at least partially shut the open surface of the housing, the shutter including an opening, the opening configured to provide a space through which a wafer of the plurality of wafers enters; and
a lifter configured to lift the shutter to position the opening at a desired height,
wherein the housing comprises a plurality of slots formed on both side inner walls of the housing to receive the wafer of the plurality of wafers in a horizontal direction,
wherein the opening is formed at the shutter in the horizontal direction to transfer the wafer of the plurality of wafers into one of the plurality of slots through the opening, and
wherein an area of the opening is configured to be maintained at any position of the shutter on the open surface,
wherein the opening has a width same as a width of the shutter.

2. The wafer container of claim 1, wherein the opening has a rectangular shape.

3. The wafer container of claim 1, wherein the area of the opening is no more than 5% of an area of the open surface of the housing.

4. The wafer container of claim 1, further comprising a pair of side beams configured to define both side surfaces of the opening.

5. The wafer container of claim 4, further comprising:
a first beam configured to define a first surface of the opening; and
a second beam configured to define a second surface of the opening.

6. The wafer container of claim 1, wherein the shutter comprises a sheet.

7. A water container comprising:
a housing configured to receive a plurality of wafers, the housing including an open surface;
a shutter proximate to the open surface and configured to at least partially shut the open surface of the housing, the shutter including an opening, the opening configured to provide a space through which a wafer of the plurality of wafers enters; and
a lifter configured to lift the shutter to position the opening at a desired height,
wherein the housing comprises a plurality of slots formed on both side inner walls of the housing to receive the wafer of the plurality of wafers in a horizontal direction,
wherein the opening is formed at the shutter in the horizontal direction to transfer the wafer of the plurality of wafers into one of the plurality of slots through the opening,
wherein an area of the opening is configured to be maintained at any position of the shutter on the open surface, and
wherein the lifter comprises:
a first roller arranged at a first end of the open surface of the housing, and the first roller configured to rotate and wind a first end of the shutter thereon;
a second roller arranged at a second end of the open surface of the housing, and the second roller configured to rotate and to wind a second end of the shutter thereon;
an actuator connected to at least one of the first roller and the second roller, and the actuator configured to provide the at least one of the first roller and the second roller with a rotary force; and a lifting member connected between the first roller and the second roller and configured to transfer the rotary force of the actuator to the shutter.

8. The wafer container of claim 7, wherein the actuator is connected to the second roller.

9. The wafer container of claim 7, wherein the lifting member comprises:

a first lifting member connected to the first roller; and a second lifting member connected to the second roller, wherein both side surfaces of the opening are positioned between the first lifting member and the second lifting member.

10. The wafer container of claim 7, wherein the actuator comprises a motor.

11. The wafer container of claim 7, wherein the lifter further comprises a spring configured to support the first roller in a winding direction of the shutter.

12. A wafer container comprising:

a housing configured to receive a plurality of wafers in a horizontal direction, the housing including an open surface;

a shutter proximate to the open surface and configured to at least partially shut the open surface of the housing, the shutter including an opening, the opening configured to provide a space through which a wafer of the plurality of wafers enters;

a first roller configured to rotate with respect to the horizontal direction, and arranged at the open surface of the housing, the first roller configured to wind a first end of the shutter thereon;

a second roller configured to rotate with respect to the horizontal direction, and arranged at the open surface of the housing, the second roller configured to wind a second end of the shutter thereon;

a pair of first lifting members connected to both ends of the first roller, wherein a first portion of the shutter above the opening is connected to the pair of first lifting members;

a pair of second lifting members connected to both ends of the second roller, wherein a second portion of the shutter under the opening is connected to the pair of second lifting members;

a pair of side beams connected between each of the first lifting members and each of the second lifting members to define both side surfaces of the opening; and an actuator configured to rotate the second roller.

13. The wafer container of claim 12, wherein an area of the opening is no more than 5% of an area of the open surface of the housing.

14. The wafer container of claim 12, further comprising:

a first beam configured to define a first surface of the opening; and a second beam configured to define a second surface of the opening.

15. The wafer container of claim 12, wherein the both side surfaces of the opening are positioned between the pair of first lifting members and the pair of second lifting members.

16. The wafer container of claim 12, further comprising a spring configured to support the first roller in a winding direction of the shutter.

17. The wafer container of claim 1, wherein the shutter comprises an upper shutter and a lower shutter, and the lifter lifts the upper shutter and the lower shutter together to define the opening between the upper shutter and the lower shutter.

18. The wafer container of claim 1, wherein the shutter comprises an upper shutter and a lower shutter, and the lifter lifts the upper shutter and the lower shutter in a same direction.

19. The wafer container of claim 1, further comprises, an upper beam;

a lower beam; and a pair of side beams connected between both ends of the upper beam and both ends of the lower beam, wherein the opening is defined by the upper beam, the lower beam, and the pair of the side beams.

* * * * *